US012729306B2

(12) United States Patent
Yamazaki

(10) Patent No.: US 12,729,306 B2
(45) Date of Patent: Sep. 8, 2026

(54) SILICONE GEL COMPOSITION, CURED PRODUCT THEREOF, AND USE THEREFOR

(71) Applicant: DOW TORAY CO., LTD., Tokyo (JP)

(72) Inventor: Ryosuke Yamazaki, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 751 days.

(21) Appl. No.: 18/015,555

(22) PCT Filed: Jul. 13, 2020

(86) PCT No.: PCT/JP2020/027250

§ 371 (c)(1),
(2) Date: Jan. 11, 2023

(87) PCT Pub. No.: WO2022/013917

PCT Pub. Date: Jan. 20, 2022

(65) Prior Publication Data

US 2023/0250284 A1 Aug. 10, 2023

(51) Int. Cl.

*C08L 83/04* (2006.01)
*C08G 77/08* (2006.01)
*C08G 77/12* (2006.01)
*C08G 77/20* (2006.01)
*C08K 3/16* (2006.01)
*C08K 5/5419* (2006.01)
*H10W 74/47* (2026.01)

(52) U.S. Cl.

CPC .............. *C08L 83/04* (2013.01); *C08G 77/08* (2013.01); *C08G 77/12* (2013.01); *C08G 77/20* (2013.01); *C08K 3/16* (2013.01); *C08K 5/5419* (2013.01); *H10W 74/476* (2026.01); *C08L 2201/08* (2013.01); *C08L 2201/10* (2013.01); *C08L 2203/206* (2013.01); *C08L 2205/025* (2013.01); *C08L 2205/035* (2013.01)

(58) Field of Classification Search

None

See application file for complete search history.

(56) References Cited

U.S. PATENT DOCUMENTS 4,072,635 A 2/1978 Jeram
5,708,067 A 1/1998 Akamatsu et al.
6,043,309 A 3/2000 Nakamura et al.
2009/0082517 A1 3/2009 Tanaka et al.
2011/0269918 A1 11/2011 Hamamoto et al.
2011/0306746 A1 12/2011 Tanaka et al.
2013/0071673 A1 3/2013 Okawa et al.
2015/0115311 A1 4/2015 Yoshida et al.
2015/0218417 A1 8/2015 Miyamoto et al.
2015/0235872 A1 8/2015 Yoshida et al.
2015/0376344 A1 12/2015 Dent et al.
2016/0215099 A1* 7/2016 Enami .................. H01L 23/296
2017/0022326 A1* 1/2017 Enami ..................... C08K 5/56
2018/0105692 A1 4/2018 Imaizumi et al.
2019/0177488 A1* 6/2019 Yamazaki ................ C08K 3/36
2020/0332122 A1 10/2020 Kim et al.

FOREIGN PATENT DOCUMENTS

CN 108795053 A 11/2018
CN 110294936 A 10/2019
GB 1534709 A 12/1978
JP S4817847 A 6/1973
JP S5141046 A 11/1976
JP S5312541 A 2/1978
JP S5312541 B2 5/1978
JP S56143241 A 11/1981
JP H09183904 A 7/1997
JP 200991561 A 4/2009
JP 2011246693 A 12/2011
JP 201217458 A 1/2012
JP 2013232580 A 11/2013
JP 201451606 A 3/2014

(Continued)

OTHER PUBLICATIONS

Machine assisted English translation of JPS5141046A obtained from https://worldwide.espacenet.com/patent on Jun. 5, 2023, 5 pages.
Machine assisted English translation of JPS5312541A obtained from https://worldwide.espacenet.com/patent on Jun. 5, 2023, 5 pages.
Machine assisted English translation of CN108795053A obtained from https://worldwide.espacenet.com/patent on Sep. 19, 2023, 24 pages.
Machine assisted English translation of CN110294936A obtained from https://worldwide.espacenet.com/patent on Sep. 19, 2023, 21 pages.
English translation of International Search Report for PCT/JP2020/027250 dated Sep. 24, 2020, 3 pages.

(Continued)

*Primary Examiner* — Randy P Gulakowski
*Assistant Examiner* — Holy Grace Hester
(74) *Attorney, Agent, or Firm* — Warner Norcross + Judd LLP

(57) ABSTRACT

Provided is a silicone gel composition that provides a silicone gel cured product having excellent storage stability as well as heat resistance and transparency at high temperatures, being capable of maintaining low elastic modulus, low stress, and high transparency even when used for long periods of time, particularly under conditions where only one direction of a member is exposed to high temperatures, and having resistance to cracking, peeling, and the like. The silicone gel composition comprises (A) a branched organopolysiloxane having an alkenyl group bonded to a silicon atom, (B-1) a branched organohydrogenpolysiloxane having three or more silicon atom-bonded hydrogen atoms in a molecule, and containing at least 20 mol % or more of T units and Q units of all siloxane units, (B-2) a chain organohydrogenpolysiloxane having two silicon atom-bonded hydrogen atoms in one molecule, (C) a platinum-based addition reaction catalyst, and (D) a reaction product of ceric salt.

16 Claims, No Drawings

(56) References Cited

FOREIGN PATENT DOCUMENTS

| | | | |
|---|---|---|---|
| JP | 2014051636 | A | 3/2014 |
| JP | 2016513165 | A | 5/2016 |
| JP | 201853015 | A | 4/2018 |
| JP | 201914779 | A | 1/2019 |
| TW | 201922937 | A | 6/2019 |
| WO | 2012086404 | A1 | 6/2012 |
| WO | 2014192969 | A1 | 12/2014 |
| WO | 2015034029 | A1 | 3/2015 |
| WO | 2015111409 | A1 | 7/2015 |
| WO | 2016136243 | A1 | 9/2016 |

OTHER PUBLICATIONS

Machine assisted English translation of WO2014192969A1 obtained from https://patents.google.com/patent on Jan. 9, 2023, 8 pages.

Machine assisted English translation of JP2018053015A obtained from https://patents.google.com/patent on Jan. 9, 2023, 11 pages.

Machine assisted English translation of JP2019014779A obtained from https://patents.google.com/patent on Jan. 9, 2023, 11 pages.

Machine assisted English translation of JPS56143241A obtained from https://worldwide.espacenet.com/patent on Jan. 10, 2023, 6 pages.

* cited by examiner

SILICONE GEL COMPOSITION, CURED PRODUCT THEREOF, AND USE THEREFOR

CROSS-REFERENCE TO RELATED APPLICATIONS

This application is the U.S. National Stage of and claims priority to International Application No. PCT/JP2020/027250 filed on 13 Jul. 2020, the content of which is incorporated herein by reference.

TECHNICAL FIELD

The present invention relates to a silicone gel composition that cures to provide a silicone gel cured product with excellent transparency, heat resistance, and crack resistance, particularly when temperature differences occur inside a member at high temperatures. The present invention also relates to an electronic component encapsulant containing the silicone gel composition and an electronic component provided with the silicone gel cured product.

BACKGROUND ART

A silicone gel composition is an addition reaction-curable organopolysiloxane composition containing organohydrogenpolysiloxane having a hydrogen atom bonded to a silicon atom (in other words, a SiH group), organopolysiloxane having an alkenyl group such as a vinyl group or the like bonded to a silicon atom, and a platinum-based catalyst to provide a gel-like cured product with low crosslinking density by additional reaction of the hydrogen atom bonded to a silicon atom with an alkenyl group (e.g. Patent Documents 1 to 3). The silicone gel cured product cured by heating the silicone gel composition has excellent heat resistance, weather resistance, oil resistance, cold resistance, and electrical insulation properties, as well as low elastic modulus and low stress, and thus is used to protect electronic components such as automotive electronic components, consumer electronic components, and the like. The low elastic modulus and low stress characteristics of the silicone gel cured product are not found in other elastomer products. Furthermore, in recent years, the demand for higher reliability of automotive electronic components and consumer electronic components and the like has increased the demand for heat resistance in silicone gel materials including silicone gel cured products used for encapsulation.

Recently, with the increased ubiquity of electronic component applications called power devices, the operating temperature of these electronic components, particularly silicon chips, has risen from about 150° C. in the past to about 175° C., and due to the increased ubiquity of SiC semiconductors, an operating temperature of 200° C. or above is often required. For this reason, methods have been proposed to improve the heat resistance of the silicone gel by adding various heat-resistant additives (e.g., Patent Documents 3 to 5). Silicone gel cured products obtained using these silicone gel compositions exhibit enough heat resistance to retain a low elastic modulus even when exposed to temperatures exceeding 200° C. for extended periods of time.

However, power semiconductor modules used in power devices generate heat during operation, and a heat source thereof is a bottom surface of the module. Thus, depending on the shape or structure of the device, only the area near the bottom surface of the module may be exposed to high heat in the silicone gel cured product required for protection, resulting in large temperature differences within the same member. A temperature gradient caused by temperature differences within such a member generates internal stress as a difference in the expansion rate inside the silicone gel cured product, and particularly with the passage of time/thermal cycling, cracks (fissures and cracks) appear in the silicone gel cured product, degrading a protective function thereof. The silicone gel compositions described in Patent Document 3 and the like provide silicone gel cured products with excellent elastic properties even at higher temperatures exceeding 200° C. However, there is still room for improvement in terms of the technical issue of preventing cracking caused by temperature differences within a member.

PRIOR ART DOCUMENTS

Patent Documents

Patent Document 1: Japanese Unexamined Patent Application S48-17847

Patent Document 2: Japanese Unexamined Patent Application S56-143241

Patent Document 3: International Publication WO2015/034029

Patent Document 4: International Publication WO2015/111409

Patent Document 5: Japanese Unexamined Patent Application 2018-53015

SUMMARY OF THE INVENTION

Problems to be Solved by the Invention

In view of the foregoing, an object of the present invention is to provide a silicone gel composition that provides a silicone gel cured product having excellent storage stability as well as heat resistance and transparency under high temperatures, being capable of maintaining a low elastic modulus, low stress, and high transparency even after long-term use at high temperatures, and having excellent crack resistance and resistance to gel degradation, even when large temperature differences occur inside a member over a long period of time, as is typical when a heat source of 200° C. or higher is installed only at a bottom surface of a silicone gel cured product. Furthermore, an object of the present invention is to provide an electronic component encapsulant containing the silicone gel composition, and an electronic component provided with a silicone gel cured product obtained by curing the silicone gel composition.

Means for Solving the Problems

As a result of the extensive studies, the present inventor discovered that the use of a branched organohydrogenpolysiloxane having a certain amount or more of branched siloxane units in a molecule as a crosslinking agent is effective in solving the aforementioned problems. In other words, the present inventors discovered that the aforementioned problems can be solved by using a silicone gel composition containing (A) a branched organopolysiloxane having a viscosity at 25° C. within a range of 10 to 10,000 mPa·s and containing at least two alkenyl groups on average in a molecule, (B-1) a branched organohydrogenpolysiloxane containing 20 mol % or more of branched siloxane units overall, (B-2) a chain organohydrogenpolysiloxane having two silicon atom-bonded hydrogen atoms in a molecule, (C) a platinum-based addition curing catalyst, and (D)

a reaction product of a specific amount of an alkali metal silanol compound and ceric salt, thereby arriving at the present invention. Note that the use of the aforementioned component (B-2) is optional, but a suitable component (B-2) is a linear organohydrogenpolysiloxane having silicon-bonded hydrogen atoms only at the molecular chain terminals. Furthermore, it was discovered that the aforementioned problems can be solved by an electronic component encapsulant containing the silicone gel composition, and an electronic component provided with a silicone gel cured product obtained by curing the silicone gel composition, thereby arriving at the present invention.

Effects Of The Invention

The composition of the present invention can provide a silicone gel cured product having excellent storage stability of the silicone gel composition as well as heat resistance and transparency under high temperatures exceeding 200° C. after being cured, being capable of maintaining a low elastic modulus, low stress, and high transparency even after long-term use at high temperatures, and having excellent crack resistance even when large temperature differences occur inside a member over a long period of time, as is typical when a heat source of 200° C. or higher is installed only at a bottom surface of a silicone gel cured product. Furthermore, the present invention can provide an electronic component encapsulant containing the silicone gel composition and an electronic component provided with the silicone gel cured product.

When used for protecting electronic components such as ICs, hybrid ICs, and the like, the silicone gel cured product obtained by curing the silicone gel composition of the present invention maintains transparency even at high temperatures of 200° C. or higher, as required for SiC semiconductors, and has excellent heat and cold resistance, and therefore is resistant to cracking and degradation over time, even under operating conditions where large temperature differences occur inside the silicone gel cured product due to the placement of heat sources and the like. Thus, it is possible to provide a highly reliable and durable electronic component.

The silicone gel composition and the cured product of the present invention can be used to provide a method of protecting semiconductor chips that are used in harsh environments, particularly those requiring high heat and cold resistance and a high degree of freedom in circuit design, including the placement of a heat source and temperature gradients inside a member. A semiconductor chip obtained by the protection method described above functions as a highly reliable and durable electronic component compared to a conventional silicone gel protection method, even when used in outer space, high latitude regions, extreme environments, and the like.

MODE FOR CARRYING OUT THE INVENTION

Each of the components will be described in detail below. Note that in the present specification, viscosity is the value measured at 25° C. using a type B viscometer in accordance with JIS K 7117-1.

[Silicone Gel Composition]

(A) Organopolysiloxane Having an Alkenyl Group

The organopolysiloxane having an alkenyl group of component (A) is one base compound (base polymer) of the silicone gel composition, and is characterized in having a viscosity within a range of 10 to 10,000 mPa·s and containing an alkenyl group bonded to at least two silicon atoms on average in a molecule. More specifically, component (A) may be one or a mixture of the following component (A-1) and component (A-2), and may also optionally contain (A-3) an alkenyl group-containing organopolysiloxane resin. In particular, from the viewpoint of both cold resistance and mechanical strength of a silicone gel cured product, it is particularly preferable to use a mixture of components (A-1) and (A-2). These components (A) can be crosslinked using a crosslinking agent containing component (B-1) to be described later to form a silicone gel cured product with almost no cracking caused by large temperature differences in a member.

(A-1) Branched Organopolysiloxane

The branched organopolysiloxane serving as component (A-1) is one base compound (base polymer) of the silicone gel composition, and is characterized in having a viscosity within a range of 10 to 10,000 mPa·s, containing an alkenyl group bonded to at least two silicon atoms on average in a molecule, and preferably having a structure branched by a certain amount of a $RSiO_{3/2}$ (where R represents a monovalent hydrocarbon group) unit.

The use of the component allows the silicone gel composition of the present invention to provide a silicone gel cured product that, in addition to the crack resistance described above, has excellent cold resistance, particularly at low temperatures below −40° C. Furthermore, when used together with component (D), it is possible to provide a silicone gel cured product with excellent heat resistance and transparency at temperatures exceeding 200° C. and being capable of maintaining low elastic modulus, low stress, and high transparency even after long-term use at high temperatures.

A branched organopolysiloxane (A-1) can be expressed by the following average structural formula (1):

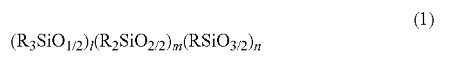

$$(R_3SiO_{1/2})_l(R_2SiO_{2/2})_m(RSiO_{3/2})_n \quad (1)$$

In Formula 1, R represents a monovalent hydrocarbon group, l, m, and n each represent one or more numbers, and preferably l+m+n+p is 200 or less.

The branched organopolysiloxane (A-1) preferably has a specific amount of a branched structure such that the silicone cured product of the present invention is provided with favorable cold resistance. Specifically, of the total siloxane units configuring the molecule of the branched organopolysiloxane (A-1), 80.0 to 99.8 mol % are preferably $R_2SiO_{2/2}$ units, 0.1 to 10.0 mol % are preferably $RSiO_{3/2}$ units, and 0.1 to 10.0 mol % are preferably $R_3SiO_{1/2}$ units. In other words, the ratio of m:n:l in Formula 1 is preferably 80.0 to 99.8:0.1 to 10.0:0.1 to 10.0. m:n:l is more preferably 80.0 to 98.9:1.0 to 10.0:0.1 to 10.0, and even more preferably 80.0 to 96.9:3.0 to 10.0:0.1 to 10.0. The branched organopolysiloxane (A-1) has such a branched structure to obtain a silicone gel cured product with excellent cold resistance, particularly at low temperatures. Note that the molar ratios of $R_2SiO_{2/2}$ units, $RSiO_{3/2}$ units, and $R_3SiO_{1/2}$ units of all siloxane units of the branched organopolysiloxane (A-1) are values determined by nuclear magnetic resonance (NMR) measurements.

Examples of monovalent hydrocarbon groups bonded to a silicon atom in a polysiloxane structural unit (i.e., the above-mentioned R) that is a side chain or end group of a main or branched chain in the branched organopolysiloxane (A-1) can include unsubstituted or substituted monovalent hydrocarbon groups that do not contain an aliphatic unsaturated bond, or monovalent alkenyl groups. When the monovalent hydrocarbon group R bonded to a silicon atom is an unsubstituted or substituted monovalent hydrocarbon group containing no aliphatic unsaturated bond, the number of carbon atoms thereof is usually 1 to 10, and preferably 1 to 6, with methyl, phenyl or 3,3,3-trifluoropropyl groups being preferred.

The branched organopolysiloxane (A-1) has at least two alkenyl groups bonded to a silicon atom on average in a molecule (hereinafter, also referred to as "silicon atom-bonded alkenyl group"). Such alkenyl groups are usually 2 to 6 carbon atoms, preferably 2 to 4, and more preferably 2 to 3, with vinyl groups being particularly preferred.

Of all monovalent hydrocarbon groups R bonded to a silicon atom in the average structural unit above of the branched organopolysiloxane (A-1), 0.10 to 4.00 mol % are preferably silicon-bonded alkenyl groups, 0.25 to 4.00 mol % are more preferably silicon-bonded alkenyl groups, and 0.50 to 2.00 mol % are more preferably silicon-bonded alkenyl groups. The branched organopolysiloxane (A-1) can contain such an amount of silicon atom-bonded alkenyl groups to obtain a flexible silicone gel cured product with a direct reading at a ¼ consistency as stipulated in JIS K 2220 within a range of 10 to 150. Note that the amount of alkenyl groups in the branched organopolysiloxane (A-1) is a value determined using a Fourier transform near infrared spectrometer.

The branched organopolysiloxane (A-1) has a viscosity within a range of 10 to 10,000 mPa·s at 25° C. The viscosity of the branched organopolysiloxane (A-1) is preferably within a range of 10 to 5,000 mPa·s at 25° C., and more preferably within a range of 10 to 1,000 mPa·s. The branched organopolysiloxane (A-1) with such viscosity provides favorable handling workability and flowability of a composition, as well as favorable strength of a resulting cured product.

The branched organopolysiloxane (A-1) can be synthesized with a desired viscosity and design structure by a conventionally known method. For example, preparation is possible by heating and equilibrium polymerization of a hydrolysate having $RSiO_{3/2}$, $R_2SiO_{2/2}$, and $R_3SiO_{1/2}$ siloxane units with $ViR_2SiOSiR_2Vi$ and cyclic polysiloxane $(R_2SiO)_n$ (In each formula, R represents a monovalent hydrocarbon group such as an alkyl group or the like, and Vi represents an alkenyl group such as a vinyl group or the like) in the presence of potassium silanolate in accordance with the Embodiments and the like in Japanese Unexamined Patent Application S61-16295.

(A-2) Linear Organopolysiloxane

The linear organopolysiloxane of component (A-2) is one base compound (base polymer) of the silicone gel composition, has a viscosity within a range of 10 to 10,000 mPa·s, and contains an alkenyl group bonded to at least two silicon atoms on average in a molecule.

The linear organopolysiloxane (A-2) can be expressed by the following average structural formula (2):

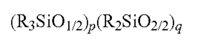

$$(R_3SiO_{1/2})_p(R_2SiO_{2/2})_q \quad (2)$$

In Formula 2, R represents the same group as the monovalent hydrocarbon group in the general formula (1) of component (A) described above, p and q each represent an integer greater than or equal to 1, and p+q is preferably 500 or less.

Of the total siloxane units configuring the linear organopolysiloxane (A-2), 90.0 to 99.9 mol % are preferably $R_2SiO_{2/2}$ units, and 0.1 to 10.0 mol % are preferably $R_3SiO_{1/2}$ units. In other words, the ratio of q:p is preferably 90.0 to 99.9:0.1 to 10.0. q:p is more preferably 95.0 to 99.5:0.5 to 5.0, and even more preferably 97.0 to 99.0:1.0 to 3.0. The linear organopolysiloxane (A2) has such a structure, such that a flexible silicone gel cured product with a direct reading value at a ¼ consistency as stipulated in JIS K 2220 within a range of 10 to 150 can be obtained. Note that the molar ratios of $R_2SiO_{2/2}$ units and $R_3SiO_{1/2}$ units of all siloxane units of the linear organopolysiloxane (A2) are values determined by nuclear magnetic resonance (NMR) measurements.

The organopolysiloxane expressed in the average structural formula (2) above may be any dimethylpolysiloxane, such as dimethylpolysiloxane blocked at both terminals with dimethylvinylsiloxy groups, dimethylsiloxane/methylvinylsiloxane copolymers blocked at both terminals with dimethylvinylsiloxy groups, dimethylsiloxane/vinylmethylsiloxane copolymers blocked at both terminals with trimethylsiloxy groups, dimethylpolysiloxane blocked at a terminal with a trimethylsiloxy group/dimethylvinylsiloxy group, dimethylsiloxane/methylvinylsiloxane copolymers blocked at a terminal with a trimethylsiloxy group/dimethylvinylsiloxy group, dimethylpolysiloxane blocked at both terminals with methyldivinylsiloxy groups, dimethylsiloxane/methylvinylsiloxane copolymers blocked at both terminals with methyldivinylsiloxy groups, dimethylpolysiloxane blocked at both terminals with trivinylsiloxy groups, dimethylsiloxane/methylvinylsiloxane copolymers blocked at both terminals with trivinylsiloxy groups, and the like. Cold resistance is not imparted to the silicone gel composition like component (A-1) above, but there is an effect of improving mechanical strength. Therefore, dimethylpolysiloxane may be used alone as component (A), but it is possible to achieve both cold resistance and mechanical strength by use in combination with component (A-1) and the phenyl group-containing polysiloxane to be described later.

On the other hand, any phenyl group-containing organopolysiloxane, such as dimethylsiloxane/diphenylsiloxane copolymers blocked at both terminals with dimethylvinylsiloxy groups, dimethylsiloxane/methylvinylsiloxane/diphenylsiloxane copolymers blocked at both terminals with dimethylvinylsiloxy groups, dimethylsiloxane/vinylmethylsiloxane/diphenylsiloxane copolymers blocked at both terminals with trimethylsiloxy groups, dimethylsiloxane/diphenylsiloxane copolymers blocked at a terminal with a trimethylsiloxy group/dimethylvinylsiloxy group, dimethylsiloxane/diphenylsiloxane/methylvinylsiloxane copolymers blocked at a terminal with a trimethylsiloxy group/dimethylvinylsiloxy group, dimethylsiloxane/diphenylsiloxane copolymers blocked at both terminals with methyldivinylsiloxy groups, dimethylsiloxane/methylvinylsiloxane/diphenylsiloxane copolymers blocked at both terminals with methyldivinylsiloxy groups, dimethylsiloxane/diphenylsiloxane copolymers blocked at both terminals with trivinylsiloxy groups, dimethylsiloxane/methylvinylsiloxane/diphenylsiloxane copolymers blocked at both terminals with trivinylsiloxy groups, and the like, can also be suitably designed with a composition using only phenyl group-containing organopolysiloxanes as component (A), which can impart cold resistance to the silicone gel composition without using component (A-1) described above, if necessary, by controlling the phenyl group content to a range to be described below.

When a phenyl group-containing organopolysiloxane is used as part or all of component (A), the phenyl group content is preferably in a range of 1 to 10 mol % of the total functional groups bonded to a silicon atom, and even more preferably in a range of 3 to 7 mol %. On the other hand, if the phenyl group content exceeds the upper limit described above, the hardness of silicone gel increases due to phenyl groups in a cured product, and the flexibility of the gel may be impaired. Depending on the blend amount, it may become difficult to form a silicone gel with the low hardness required for stress relief properties. Furthermore, if the phenyl group content is less than the lower limit described above, the silicone gel having a dimethylpolysiloxane skeletal structure may not have sufficient cold resistance.

Note that as with the aforementioned component (A-1), a phenyl group-containing organopolysiloxane can be used as a base compound and the dimethylpolysiloxane described above can be added to improve the mechanical strength of silicone gel obtained by curing the silicone gel composition of the present invention. In this case, the phenyl group content is preferably within the aforementioned range. In particular, if the phenyl group content exceeds the upper limit described above, mutual dissolving with the dimethylpolysiloxane used in combination may become difficult, and the uniformity of the overall composition may be impaired.

Of all monovalent hydrocarbon groups R bonded to a silicon atom in a structural unit of the linear organopolysiloxane (A-2), 0.25 to 4.00 mol % are preferably silicon-bonded alkenyl groups, 0.50 to 3.00 mol % are more preferably silicon-bonded alkenyl groups, and 1.00 to 2.00 mol % are more preferably silicon-bonded alkenyl groups. The linear organopolysiloxane (A-2) can contain such an amount of silicon atom-bonded alkenyl groups, such that a flexible silicone gel cured product with a direct reading value at a ¼ consistency as stipulated in JIS K 2220 within a range of 10 to 150 can be obtained. Note that the amount of alkenyl groups in the linear organopolysiloxane (A-2) is a value determined using a Fourier transform near infrared spectrometer.

The linear organopolysiloxane (A-2) has a viscosity at 25° C. in a range of 1.0 to 10,000 mPa·s, preferably in a range of 1.0 to 1,000 mPa·s, and more preferably in a range of 5.0 to 500 mPa·s. The linear organopolysiloxane (A-2) having such viscosity can impart favorable handling workability and flowability to a composition and favorable strength to a resulting cured product.

As for the quantitative relationship between the component (A-1) and the component (A-2), as described above, each may be used alone or in combination, and from the viewpoint of the ability to establish both cold resistance and mechanical strength of a resulting silicone gel, the dimethylpolysiloxane-based component (A-2) is 2 to 150 mass parts, and preferably 2 to 100 mass parts with respect to 100 mass parts of component (A-1) or phenyl group-containing component (A-2). By setting the ratio in this quantitative range, the physical properties of a resulting silicone gel cured product can be improved while improving the cold resistance of a resulting silicone gel, and the stability and handling of the composition can be further improved, which is also advantageous in terms of cost.

(A-3) Organoposiloxane Resin

Component (A-3) contains at least two alkenyl groups on average in a molecule, and is an organopolysiloxane resin containing at least 20 mol % or more of a siloxane unit selected from siloxane units expressed by $RSiO_{3/2}$ (where R represents a monovalent organic group) and siloxane units expressed by $SiO_{4/2}$ out of all siloxane units.

The alkenyl group in component (A-3) has hydrosilylation reactivity, and therefore is incorporated into a crosslinking reaction that forms a silicone gel, which is expected to improve the mechanical strength of the resulting gel. Such alkenyl groups are the same groups as described above, and vinyl groups or hexenyl groups are particularly preferred.

Examples of the group bonded to a silicon atom other than the hydrosilylation reactive group in component (A-3) include an alkyl group having 1 to 20 carbon atoms, a halogen-substituted alkyl group having 1 to 20 carbon atoms, an aryl group having 6 to 20 carbon atoms, a halogen-substituted aryl group having 6 to 20 carbon atoms, an aralkyl group having 7 to 20 carbon atoms, an alkoxy group, and a hydroxyl group. From the viewpoint of mutual dissolving properties with another component included in the composition, alkyl groups, and particularly methyl groups, are preferred.

The amount of component (A-3) added is arbitrary, but the component can be added within a range of 0.0 to 10.0 mass % with respect to the overall composition, preferably 0.1 to 7.5 mass %, and particularly preferably 0.1 to 5.0 mass %. In addition to the component (A-1) and component (A-2) above, the mechanical strength of a resulting silicone gel can be improved by bringing the amount of component (A-3) within this range. If the amount of component (A-3) added is less than 0.10 mass %, an effect of improving mechanical strength cannot be obtained. Conversely, if the amount of exceeds 10.0 mass %, not only does a silicone gel cured product become too hard, but also the viscosity of a resulting composition at 25° C. may become too high, which is not preferable for practical use.

(B-1) Branched Organohydrogenpolysiloxane

A branched organohydrogenpolysiloxane of component (B-1) is one of the characteristic components of the present invention, and is a component that reacts with the component (A) described above and acts as a crosslinking agent in the present composition to effectively suppress the crack resistance of a resulting silicone gel cured product (particularly cracking, breaking, and the like based on internal stress caused by temperature differences inside a member). Such a branched organohydrogenpolysiloxane has a viscosity in a range of 2 to 1000 mPa·s, has at least three hydrogen atoms bonded to a silicon atom in a molecule, and contains at least 20 mol % of siloxane units expressed by $R'SiO_{3/2}$ or $SiO_{4/2}$ of all siloxane units.

The organohydrogenpolysiloxane (B-1) has at least three hydrogen atoms bonded to a silicon atom (SiH group) in a molecule. The number of silicon atom-bonded hydrogen atoms (SiH groups) in a molecule of such a branched organohydrogenpolysiloxane is preferably 3 to 500, more preferably 4 to 200, even more preferably 5 to 100, and particularly preferably 10 to 80. The amount of silicon atom-bonded hydrogen atoms in the organohydrogenpolysiloxane (B) can be measured by an infrared spectrometer.

The branched organohydrogenpolysiloxane (B-1) must contain at least 20 mol % or more of siloxane units expressed by $R'SiO_{3/2}$ or $SiO_{4/2}$ from the total of siloxane units in a molecule thereof, and if the amount of these branched units is below the lower limit described above, sufficient crack resistance may not be achieved.

The organohydrogenpolysiloxane serving as component (B-1) is preferably a branched organohydrogenpolysiloxane expressed by the following average unit formula:

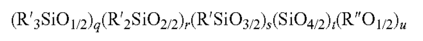

In the formula, each R' is the same or different monovalent hydrocarbon group or hydrogen atom having 1 to 10 carbon atoms without an aliphatic unsaturated carbon bond, wherein at least three R' in one molecule are hydrogen atoms. From an industrial perspective, methyl groups or phenyl groups are preferred as the monovalent hydrocarbon groups serving as R' other than hydrogen atoms.

On the other hand, R" represents an alkyl group having a hydrogen atom or 1 to 10 carbon atoms, a hydrogen atom, a methyl group or an ethyl group, and a hydroxyl group, methoxy group or ethoxy group is formed as OR".

In the formula, q, r, s, t, and u are numbers that satisfy the following: $0.1 \leq q \leq 0.8$, $0 \leq r \leq 0.5$, $0 \leq s \leq 0.8$, $0 \leq t \leq 0.6$, $0 \leq u \leq 0.05$, where $s+t \geq 0.2$ and $l+m+n+p=1$. Herein, when the present composition is used in the molding process, the organohydrogenpolysiloxanes resin serving as a part of component (d2) is specifically preferably a $M^HMT$ resin, $M^HMTT^H$ resin, $M^HMTQ$ resin, $M^HMQ$ resin, $M^HMTT^HQ$, or $M^HQ$ resin.

The organohydrogenpolysiloxane of component (B-1) is particularly preferably an $M^HQ$ resin as expressed by the following.

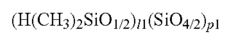

Here, $l1+p1=1$, and it is preferable to have $0.1 \leq l1 \leq 0.80$ and $0.20 \leq p1 \leq 0.90$.

The amount of the branched organopolysiloxane of component (B-1) is preferably an amount at which hydrogen atoms bonded to a silicon atom are 0.1 to 0.8 with respect to one alkenyl group in component (A), and more preferably 0.2 to 0.75. By making the amount of the branched organohydrogenpolysiloxane (B-1) in the silicone gel composition be within this range, the crack resistance with respect to internal stress generated by a temperature gradient in the silicone gel can be improved. If the number of silicon atom-bonded hydrogen atoms from component (B-1) is less than the lower limit described above with respect to one alkenyl group of component (A), sufficient crack resistance cannot be obtained. Furthermore, if a number higher than the upper limit described above is used, the crosslinking density of a resulting silicone gel becomes too high and thus crack resistance decreases.

The organohydrogenpolysiloxane (B-1) has a viscosity at 25° C. in a range of 2.0 to 1,000 mPa·s, preferably in a range of 2.0 to 500 mPa·s, and more preferably in a range of 2.0 to 150 mPa·s. The organohydrogenpolysiloxane (B) with such viscosity provides favorable handling workability and flowability of a composition, as well as favorable strength of a resulting cured product.

(B-2) Chain Organohydrogenpolysiloxane

The chain organohydrogenpolysiloxane of component (B-2) reacts with the aforementioned component (A) along with the aforementioned component (B-1) to act as a cross-linking agent of the present composition. Such a chain organohydrogenpolysiloxane has a viscosity in a range of 2 to 1000 mPa·s and has a hydrogen atom bonded to two silicon atoms.

The organohydrogenpolysiloxane (B-2) has a chain-like structure, preferably linear, and contains two hydrogen atoms bonded to a silicon atom (SiH group) in one molecule. The SiH groups are preferably positioned at both terminals of the chain.

Such a chain organopolysiloxane (B-2) can be suitably expressed by the following average structural formula 4:

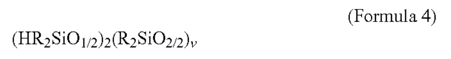

In Formula 4, R represents a monovalent hydrocarbon group having 1 to 10 carbon atoms without an aliphatic unsaturated carbon bond like in component (B-1) described above. From an industrial viewpoint, methyl groups or phenyl groups are preferred. Furthermore, in the formula, v represents a number of 1 or greater, and 2+v is preferably 500 or less.

The linear organohydrogenpolysiloxane (B-2) has a viscosity at 25° C. in a range of 2.0 to 1,000 mPa·s, preferably in a range of 2.0 to 500 mPa·s, and more preferably in a range of 2.0 to 150 mPa·s. The organohydrogenpolysiloxane (B) with such viscosity provides favorable handling workability and flowability of a composition, as well as favorable strength of a resulting cured product.

An example of such a chain organohydrogenpolysiloxane (B-2) includes a dimethylpolysiloxane blocked at both molecular chain terminals with dimethylhydrogensiloxy groups expressed by the following:

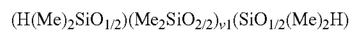

Herein, v1 represents a number at which the viscosity at 25° C. is in a range of 2.0 to 500 mPa·s, and more preferably in a range of 2.0 to 150 mPa·s, and Me represents a methyl group.

Examples of other components (B-2) include the following chain organohydrogenpolysiloxanes. Note that in the formulae, Me and Ph represent a methyl group and a phenyl group, respectively, v2 represents an integer from 1 to 100, and v3 represents an integer from 1 to 50.

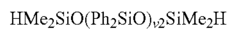

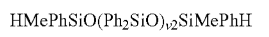

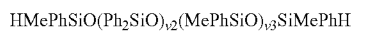

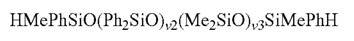

The amount of chain organohydrogenpolysiloxane (B-2) in the silicone gel composition is preferably an amount at which hydrogen atoms bonded to a silicon atom are 0 to 0.9 with respect to one alkenyl group of component (A), and more preferably 0.1 to 0.9.

The use of component (B-2) is optional, and is mainly used to bring the number of hydrogen atoms bonded to a silicon atom with respect to one alkenyl group of component (A) in the composition closer to 1.0. As described above, if the ratio of alkenyl groups to SiH groups in the composition of component (B-1) alone is brought closer to 1.0:1.0, the crosslinking density tends to become too high and the crack resistance decreases. Therefore, by using this in combination with component (B-2), the total number of hydrogen atoms bonded to a silicon atom can be adjusted to 0.7 to 1.2 hydrogen atoms per alkenyl group bonded to a silicon atom in the entire silicone gel composition, such that a silicone gel cured product with excellent heat resistance and physical properties can be obtained.

If the number of silicon atom-bonded hydrogen atoms derived from component (B-2) is greater than the aforementioned upper limit with respect to 1.0 alkenyl group in component (A), the heat resistance of a cured product may decrease. Furthermore, if component (B-2) is not used, and if the upper limit of the amount used is exceeded, the curability or physical properties of a resulting silicone gel cured product may deteriorate significantly, which is not preferable.

From the viewpoint of physical properties including heat/cold resistance and crack resistance of a silicone gel cured product obtained by curing the silicone gel composition of the present invention, the total number of hydrogen atoms bonded to a silicon atom in component (B-1) and component (B-2) is within a range of 0.7 to 1.2, and preferably 0.8 to 1.0 with respect to 1.0 alkenyl group in the entire composition.

(C) Platinum-Based Addition Reaction Catalyst

Component (C) of the present invention is used as a catalyst to promote the addition reaction (i.e., hydrosilylation reaction) between the silicon atom-bonded alkenyl groups in component (A) above and the silicon atom-bonded hydrogen atoms in component (B-1) and component (B-2) above. Such a component (C) can be a known platinum-based compound (platinum or platinum-containing compound). Platinum-alkenylsiloxane complexes are particularly preferred due to being highly effective in promoting the hydrosilylation reaction, with 1,3-divinyl-1,1,3,3-tetramethyldisiloxane complexes being particularly preferable. One type of these hydrosilylation reaction catalysts may be used alone, or two or more types may be used in combination. Furthermore, to improve the stability of the platinum-alkenylsiloxane complex, component (C) may be dissolved in an alkenylsiloxane oligomer, dimethylsiloxane oligomer, or other organosiloxane oligomer.

From the perspective of improving handling workability and pot life of the composition, the platinum-based addition reaction catalyst serving as component (C) may be a thermoplastic resin particle containing a hydrosilylation reaction catalyst that contains platinum, which is a catalyst dispersed or encapsulated in a thermoplastic resin such as a silicone resin, a polycarbonate resin, an acrylic resin, or the like. Furthermore, some or all of the platinum-based addition reaction catalyst serving as component (C) may be a hydrosilylation reaction catalyst that is not active without high-energy beam irradiation but is active in the composition upon irradiation with a high-energy beam, or may be a high-energy beam-activated or photo-activated catalyst represented by (methylcyclopentadienyl)trimethylplatinum (IV), bis(2,4-pentanedionato)platinum (II), and the like.

The blend amount of component (C) may be an effective amount and may be increased or decreased based on a desired curing rate. However, in general, the amount of platinum-based metal is usually 0.1 to 1,000 ppm, and preferably 1 to 300 ppm, with respect to the mass of the entire composition. Even if the blend amount exceeds the upper limit of the range above, there is no advantage in terms of curing rate, and it is economically disadvantageous in terms of the price (cost) of platinum.

(D) Reaction Product of (d1) Alkali Metal Silanolate and (d2) One or More Types of Ceric Salts Selected From Cerium Chloride or Carboxylates of Cerium Component (D) is used to improve the heat resistance of the present composition. Such a reaction product of component (D) particularly preferably contains 0.5 to 5.0 mass % cerium (metal). Furthermore, the alkali metal silanolate (d-1) is preferably an alkali metal silanolate compound obtained by further reacting a reaction product obtained by ring-opening reacting (d1-1) one or more cyclic organopolysiloxanes using (d1-2) an alkali metal hydroxide, with (d1-3) an organopolysiloxane having a viscosity at 25° C. within a range of 10 to 10,000 mPa·s.

The cyclic organopolysiloxane of component (d1-1) is not particularly limited, and an example can include a cyclic organopolysiloxane having the following general formula (3).

[Formula 1]

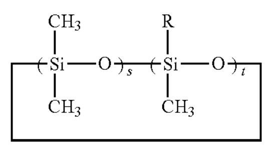

(3)

In Formula 3, R represents the same group as the monovalent hydrocarbon group in the general formula (1) of component (A) described above, and s and t each represent an integer from 0 to 8, respectively, where $3 \leq m+n \leq 8$.

(d1-1) Examples of cyclic organopolysiloxanes include hexamethylcyclotrisiloxane (D3), octamethylcyclotetrasiloxane (D4), decamethylcyclopentasiloxane (D5), dodecamethylcyclotetrasiloxane (D6), 1,1-diethylhexamethylcyclotetrasiloxane, phenylheptamethylcyclotetrasiloxane, 1,1-diphenylhexamethylcyclotetrasiloxane, 1,3,5,7-tetravinyltetramethylcyclotetrasiloxane, 1,3,5,7-tetramethylcyclotetrasiloxane, 1,3,5,7-tetracyclohexyltetramethylcyclotetrasiloxane, tris(3,3,3-trifluoropropyl) trimethylcyclotrisiloxane, 1,3,5,7-tetra(3-methacryloxypropyl)tetramethylcyclotetrasiloxane, 1,3,5,7-tetra(3-acryloxypropyl)tetramethylcyclotetrasiloxane, 1,3,5,7-tetra(3-carboxypropyl)tetramethylcyclotetrasiloxane, 1,3,5,7-tetra(3-vinyloxypropyl)tetramethylcyclotetrasiloxane, 1,3,5,7-tetra(p-vinylphenyl)tetramethylcyclotetrasiloxane, 1,3,5,7-tetra[3-(p-vinylphenyl)propyl]tetramethylcyclotetrasiloxane, 1,3,5,7-tetra(N-acryloyl-N-methyl-3-aminopropyl)tetramethylcyclotetrasiloxane, 1,3,5,7-tetra(N,N-bis(lauroyl)-3-aminopropyl)tetramethylcyclotetrasiloxane, and the like. Furthermore, a mixture of these various organopolysiloxanes is also possible.

The alkali metal hydroxide of component (d1-2) is not particularly limited, and examples include sodium hydroxide, potassium hydroxide, and the like. The amount of such a component (d1-2) is not particularly limited, but generally is 0.1 to 10.0 mass parts with respect to 100 mass parts of component (d1-1).

The organopolysiloxane of component (d1-3) may be a conventionally known organopolysiloxane having a viscosity at 25° C. within a range of 100 to 1,000,000 mPa·s, which may be a linear or branched structure substantially containing repeating diorganopolysiloxane units (linear structures) and remaining a liquid at ambient temperature. The organic group (i.e., unsubstituted or substituted monovalent hydrocarbon group) bonded to the silicon atom can be the same as that exemplified as R in the general formula (1) of component (A), with methyl, phenyl or 3,3,3-trifluoropropyl groups being preferred. Examples of these organopolysiloxanes include those whose molecular chain terminals are blocked with trimethylsiloxy groups and other trialkylsiloxy groups, vinyl dimethylsiloxy groups and other alkenyldialkylsiloxy groups, divinylmethylsiloxy groups and other dialkenylalkylsiloxy groups, and trivinylsiloxy groups and other trialkenylsiloxy groups, and other triorganosiloxy groups, hydroxyl groups, alkoxy groups, and the like.

The viscosity of the organopolysiloxane of component (d1-3) at 25° C. is within a range of 10 to 10,000 mPa·s, and more preferably within a range of 50 to 1,000 mPa·s. When the viscosity of component (d1-3) is 10 mPa·s or less, siloxane evaporation at high temperatures tends to increase, resulting in a large mass change. The amount of such a component (d1-3) is not particularly limited, but generally is 0.1 to 10 mass parts with respect to 100 mass parts of component (d1-1).

The ceric salt of component (d2) is cerium chloride or a carboxylate of cerium, and the carboxylate of cerium is expressed by the general formula: $(R^4COO)_nM^1$. Herein, $R^4$ represents the same or different monovalent hydrocarbon group, and $M^1$ represents cerium or a rare earth element mixture with cerium as a main component. Examples of ceric salts include 2-ethylhexanoic acid, naphthenic acid, oleic acid, lauric acid, stearic acid, and the like. Note that the carboxylate of cerium is preferably used as an organic solvent solution from the perspective of ease of handling, and examples of the organic solvent include standard solvents, mineral spirits, ligroin, petroleum ether, and other petroleum solvents, and toluene, xylene, and other aromatic solvents.

The amount of the ceric salt in component (d2) is not particularly limited, but the amount of cerium is preferably 0.05 to 5 mass parts, and more preferably 0.1 to 3 mass parts, with respect to a total of 100 mass parts of component (d1) above.

Component (D) is added at 0.20 to 10.0 mass parts with respect to 100 mass parts of component (A), preferably added at 0.2 to 5.0 mass parts, particularly preferably added at 0.20 to 0.5 mass parts, and more specifically added at a small amount of approximately 0.2 mass parts, 0.3 mass parts, or 0.4 mass parts. Furthermore, the amount of component (D) added to the total composition is preferably an amount at which the cerium metal content in component (D) is 0.005 to 0.15 mass %, and more preferably 0.01 to 0.1 weight %. Keeping the amount of component (D) within this range is advantageous in terms of heat resistance of a resulting silicone gel composition. If the amount of component (D) added is less than 0.20 mass parts, an effect of improving heat resistance at high temperatures is not observed. On the other hand, if the amount exceeds 15 mass parts, the transparency of a silicone gel cured product is reduced and the cost of the silicone gel composition increases, which is economically disadvantageous.

Component (D) can be obtained by mixing components (d1) and (d2) and then heat-treating at a temperature of 150° C. or higher. The heating temperature of heat treatment is preferably 150 to 310° C., more preferably 200 to 305° C., and even more preferably 250 to 300° C. If the heating temperature is less than 150° C., it is difficult to obtain a uniform composition, and if the temperature exceeds 310° C., the component (d1-3) has a larger thermal decomposition rate, for example.

(Other Optional Components)

In addition to the above components (A) to (D), the composition of the present invention may contain an optional component within a scope that does not impair an object of the present invention. Examples of the optional component include reaction inhibitors, inorganic fillers, organopolysiloxanes that do not contain silicon atom-bonded hydrogen atoms and silicon atom-bonded alkenyl groups, adhesion imparting agents, heat resistance imparting agents, flame retarders, thixotropy imparting agents, pigments, dyes, and the like.

The adhesion imparting agent is a component that improves the adhesion of the silicone gel to a base material or the like, and may contain, for example, an organosilicon compound selected from: silane coupling agents; tetraethyl titanate, tetrapropyl titanate, tetrabutyl titanate, tetra(2-ethylhexyl) titanate, titanium ethylacetonate, titanium acetylacetonate, and other titanium compounds; ethylacetoacetate aluminum diisopropylate, aluminum tris(ethylacetoacetate), alkylacetoacetate aluminum diisopropylate, aluminum tris (acetylacetonate), aluminum monoacetylacetonate bis(ethylacetoacetate), and other aluminum compounds; zirconium acetylacetonate, zirconium butoxyacetylacetonate, zirconium bisacetylacetonate, zirconium ethylacetoacetate, and other zirconium compounds; and silanes and partially hydrolyzed condensates thereof disclosed in Japanese Unexamined Patent Application 2002-322364. These adhesion imparting agents can be used optionally to the extent that a silicone gel cured product containing the adhesion imparting agent according to the present invention is substantially transparent when evaluated by the method described in the Embodiments section of the present application, and provides a silicone gel composition with a direct reading of a ¼ consistency stipulated in JIS K2220 of 200 or less. In particular, it is preferable to select and use an adhesion imparting agent or a quantitative range in which the type and amount do not reduce the transparency of the silicone gel cured product or cause curing inhibition, and it is most preferable to use the aforementioned titanium compounds, silanes and partially hydrolyzed condensates thereof disclosed in Japanese Unexamined Patent Application 2002-322364, or combinations thereof. Herein, the amount of the aforementioned adhesion imparting agent is not limited, but is preferably within a range of 0.001 to 5.0 mass % of the entire composition.

A reaction inhibitor is a component for inhibiting a hydrosilylation reaction of the silicone gel composition, specific examples of which include acetylene-based reaction inhibitors such as ethynylcyclohexanol, and amine-based, carboxylic acid ester-based, phosphite ester-based reaction inhibitors. The addition amount of the reaction inhibitor is typically 0.001 to 5% by mass of the total silicone gel composition.

Examples of inorganic fillers include fumed silica, crystalline silica, precipitated silica, hollow fillers, silsesquioxane, fumed titanium dioxide, magnesium oxide, zinc oxide, iron oxide, aluminum hydroxide, magnesium carbonate, calcium carbonate, zinc carbonate, laminar mica, carbon black, diatomaceous earth, glass fibers, and other inorganic fillers; fillers obtained by hydrophobically treating the surface of such inorganic fillers with organoalkoxysilane compounds, organochlorosilane compounds, organosilazane compounds, low molecular weight siloxane compounds, or other organosilicon compounds; and the like. Furthermore, silicone rubber powder, silicone resin powder and the like may also be blended. However, if the silicone gel composition requires low viscosity and transparency, the inorganic filler is preferably not added, but even if the filler is added, an amount of 20 mass % or less of the composition, and particularly an amount of 10 mass % or less is preferred.

[Preparation of Silicone Gel Composition]

The silicone gel composition of the present invention can be prepared by mixing the components (A) to (D) above (including optional components, if added) in accordance with a usual method. In doing so, the components to be mixed may be divided into two or more parts and mixed as needed. For example, a part including a portion of component (A) and components (C) and (D) and a part including the remainder of component (A) and component (B) may be prepared by mixing these two parts after dividing them and mixing them respectively. In particular, any of the parts preferably contain the aforementioned reaction inhibitor as an optional component.

The method for mixing the components of the silicone composition may be a conventional known method and is not particularly limited, but is normally uniform mixing by simple stirring. Moreover, if a solid component such as an inorganic filler is contained as any component, mixing using a mixing apparatus is more preferable. While not particularly limited thereto, exemplary such mixing apparatuses may include a single or twin shaft continuous mixer, two rolls, Ross mixer, Hobart mixer, dental mixer, planetary mixer, kneader mixer, Henschel mixer, etc.

The resulting silicone gel composition has excellent storage stability and can be suitably used as an encapsulant for electronic components. In particular, by using the silicone gel composition as an encapsulant for a semiconductor chip, the semiconductor chip can be effectively protected without cracking problems due to a heat source or local heating, even in harsh environments where excellent heat resistance is required.

[Curing of Silicone Gel Composition]

A silicone gel cured product is a silicone gel, which can be prepared by curing the silicone gel composition of the present invention at ambient temperature or under temperature conditions appropriate for the application. The temperature conditions for curing the silicone composition are not particularly limited, but are usually within a range of 60° C. to 150° C.

[Silicone Gel Cured Product]

The silicone gel cured product has excellent heat resistance and transparency at temperatures exceeding 200° C., and can maintain low elastic modulus, low stress, and high transparency even after long-term use at high temperatures. Furthermore, the silicone gel cured product has properties of being resistant to cracking and other defects due to temperature differences and internal stress inside a member, even if left for a long-period of time in a condition in which only one direction of the silicone gel cured product is exposed to high temperatures, as is typical when a high-temperature heat source is installed only on one surface (i.e. bottom surface) of the silicone gel cured product. Furthermore, when used for the protection of electronic components such as semiconductor chips, SiC semiconductor chips, ICs, hybrid ICs, power devices, and the like, transparency is maintained even under high temperatures and heat resistance is excellent, which is expected to not only improve long-term durability but also reduce degradation under low temperatures. Therefore, an electronic component with high reliability and durability can be provided under harsh use conditions with severe temperature differences. In particular, electronic components provided with the silicone gel cured product as an encapsulant have high reliability and high durability even under harsh use conditions with severe temperature differences. Note that the aforementioned semiconductor chip includes a light-emitting semiconductor element such as an LED or the like.

(¼ Consistency)

The direct reading (reading unit of 1/10 mm) of ¼ consistency stipulated in JIS K 2220 of the silicone gel cured product is preferably 10 to 150, more preferably 20 to 120, and even more preferably 30 to 100. The silicone gel cured product exhibiting a direct reading of ¼ consistency stipulated in JIS K 2220 in this range has the silicone gel cured product characteristics of low elastic modulus and low stress. If probe penetration is less than 10, achieving the characteristics of a cured silicone gel product, such as low elastic modulus and low stress, will be difficult, but if probe penetration exceeds 150, maintaining the form of the silicone gel cured product will be difficult, and flowing will occur. Note that "direct reading of ¼ consistency," similar to the penetration test using a ¼ cone stipulated in JIS K 2220, is the value obtained by dropping a ¼ cone from the surface of a specimen and reading the depth to which the cone penetrates, using the ¼ consistency gauge of JIS K 2220.

(Transparency)

The silicone gel cured product is substantially transparent. "Substantially transparent" refers, for example, to a sufficient transparency where, after the silicone gel composition is poured gently into an aluminum cup to a thickness of 10 mm and then heated to prepare a silicone gel cured product with a thickness of 10 mm, the bottom surface of the aluminum cup is visible when the silicone gel cured product is viewed from above. Such transparency of the silicone gel cured product makes them useful as encapsulants and the like for power devices and other semiconductors.

EMBODIMENTS

The silicone gel composition and silicone cured product of the present invention will be described in detail based on embodiments. Note that the present invention is not limited by the descriptions of the following examples, so long as a gist thereof is exceeded. Note that in the embodiments, the viscosity is the value at 25° C.

[Synthesis of Component D]

Component D was synthesized by the following method. 120 g of dimethylpolysiloxane blocked at both molecular chain terminals with trimethylsiloxy groups and having a viscosity of 20 mPa·s and 0.5 g of hexamethylphosphoamide were added to 60 g of a potassium silanolate compound prepared by ring-opening reacting a mixture of hexamethylcyclotrisiloxane and octamethylcyclotetrasiloxane with potassium hydroxide, which was then reacted for two hours at 115° C. under nitrogen flow to prepare a potassium silanolate compound. 100 g of the potassium silanolate compound was dissolved in 150 g of isopropanol, which was stirred and reacted with a mixture of 2.5 g of anhydrous cerium chloride, 50 g of ethanol, and 5.0 g of methanol added dropwise. The reaction mixture was filtered, and the filtrate was heated to 40 to 50° C. under reduced pressure to remove ethanol and methanol. This was then filtered again to prepare a pale yellow liquid reaction product. The cerium concentration in the reaction product was 1.4 weight %.

[Evaluation of Silicone Gel Composition and Silicone Gel Cured Product]

The storage stability of the silicone gel composition of the present invention and the transparency, ¼ consistency, heat resistance, and crack resistance of the silicone gel cured product were measured as follows.

(¼ Consistency of Silicone Gel Cured Product)

The silicone gel composition was gently poured into a 50 mL glass beaker until a height of 3 cm from the bottom of the beaker was reached, and then heated at 80° C. for one hour to prepare a silicone gel cured product. The ¼ consistency of the silicone gel cured product was measured in accordance with a method stipulated in JIS K 2220. Note that the ¼ consistency of the silicone gel cured product is the direct reading (reading unit of 1/10 mm) of the ¼ consistency stipulated in JIS K 2220, as described above.

(Heat Resistance of Silicone Gel Cured Product)

The silicone gel cured product cured by the method was placed in an oven at 225° C. for 1000 hours, and then removed and cooled to 25° C. at room temperature. Thereafter, the ¼ consistency of the silicone gel cured product was measured in accordance with the method stipulated in JIS K 2220. Note that the ¼ consistency of the silicone gel cured product is the direct reading (reading unit of 1/10 mm) of the ¼ consistency stipulated in JIS K 2220, as described above.

(Crack Resistance of Silicone Gel Cured Product)

The silicone gel cured product cured by the method above was placed on a hot plate heated to 225° C., and observation of the appearance condition of the silicone gel was continued for 1000 hours through a beaker. If cracking was visually observed within 1000 hours, the time was recorded.

Embodiments 1 to 11 and Comparative Examples 1 to 5

The following components were uniformly mixed in the compositions (weight parts) shown in Table 1, and 16 silicone gel compositions were prepared. These silicone gel compositions were cured using the methods described in the respective evaluation methods above, and the ¼ consistency, heat resistance, and crack resistance of the resulting silicone gel cured products were evaluated. The results are summarized in Tables 1 and 2 below.

Note that SiH(B-1), SiH(B-2), and SiH/SiCH=$CH_2$ in the table represent the number of mols of silicon atom-bonded hydrogen atoms in component (B-1), component (B-2), and the sum of components (B-1) and (B-2) with respect to one mol of vinyl groups in component (A), respectively. Furthermore, for component (C), the platinum metal content in the composition is shown in ppm in the table.

Component A-1: Branched polyorganopolysiloxane obtained by the aforementioned method, having a viscosity of 680 mPa·s, and containing 94.5 mol % of $(CH_3)_2SiO_{2/2}$ units, 2.3 mol % of $CH_3SiO_{3/2}$ units, 2.3 mol % of $(CH_3)_3SiO_{1/2}$ units, and 0.9 mol % of $(CH_3)_2(CH_2{=}CH)SiO_{1/2}$ units (vinyl group content=0.21 weight %)

Component A-2-1: Linear dimethylpolysiloxane blocked at both molecular chain terminals with dimethylvinylsiloxy groups, having a viscosity of 2,200 mPa·s, as expressed by the (formula):

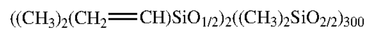

(vinyl group content = 0.22 weight %)

Component A-2-2: Linear dimethylpolysiloxane blocked at both molecular terminals with dimethylvinylsiloxy groups, having a viscosity of 2,000 mPa·s of the (formula):

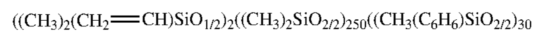

(vinyl group content = 0.18 weight %)

Component B-1: Branched organosiloxane having a viscosity of 25 mPa/s, as expressed by the (formula):

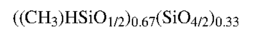

(silicon atom – bonded hydrogen atom content = 0.96 weight %)

Component B-2: Linear dimethylpolysiloxane blocked at both molecular chain terminals by dimethylhydrogensiloxy groups, having a viscosity of 16 mPa·s (silicon atom-bonded hydrogen atom content=0.13 weight %)

Component B-3: Linear copolymer of dimethylsiloxane and methylhydrogensiloxane blocked at both molecular chain terminals with trimethylsiloxy groups, having a viscosity of 4 mPa·s (silicon atom-bonded hydrogen atom content=0.70 weight %)

Component C: Complex of platinum and 1,3-divinyl-1,1,3,3,-tetramethyldisiloxane, having a platinum content of 0.5 weight % (vinyl group content=2.48 weight %)

Component D: Reactant of alkali metal silanolate and cerium chloride prepared by the method described above;

Component A-3: Branched polyorganosiloxane that is a white solid at 25° C., as expressed by the average unit formula:

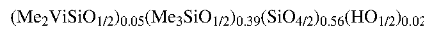

(vinyl group content = 1.9 weight %)

TABLE 1

| | Embodiment 1 | Embodiment 2 | Embodiment 3 | Embodiment 4 | Embodiment 5 | Embodiment 6 |
|---|---|---|---|---|---|---|
| A-1 | 98.8 | 54.1 | 95.6 | 91.2 | 85.5 | 86.7 |
| A-2-1 | | 40 | | 5 | 10 | 5 |
| A-2-2 | | | | | | |

TABLE 1-continued

| | | | | | | |
|---|---|---|---|---|---|---|
| A-3 | | | | | | 3 |
| B-2 | | 5.3 | 3.6 | 2.9 | 3.7 | 4.4 |
| B-1 | 0.6 | 0.1 | 0.3 | 0.4 | 0.3 | 0.4 |
| B-3 | | | | | | |
| C | 10 | 10 | 10 | 10 | 10 | 10 |
| Pt metal content [ppm] | | | | | | |
| D | 0.5 | 0.5 | 0.5 | 0.5 | 0.5 | 0.5 |
| SiH (b-1) | 0.75 | 0.13 | 0.39 | 0.51 | 0.39 | 0.41 |
| SiH (b-2) | 0 | 0.87 | 0.60 | 0.48 | 0.61 | 0.59 |
| SiH/Vi | 0.75 | 1.00 | 0.99 | 0.99 | 1.00 | 1.00 |
| 1/4 consistency | 60 | 53 | 51 | 40 | 57 | 24 |
| 1/4 consistency (after 225C/ 1000 hrs) | 53 | 48 | 43 | 38 | 51 | 22 |
| Crack resistance | 900 hrs | 730 hrs | 810 hrs | 1000 hrs | 1000 hrs | 1000 hrs |

| | Embodiment 7 | Embodiment 8 | Embodiment 9 | Embodiment 10 | Embodiment 11 |
|---|---|---|---|---|---|
| A-1 | | | | | |
| A-2-1 | 98.86 | 93.88 | 95.45 | | |
| A-2-2 | | | | 95.05 | 89.8 |
| A-3 | | | 0.875 | | 3.5 |
| B-2 | | 5.52 | 4.5 | 4.35 | 6.1 |
| B-1 | 0.64 | 0.1 | 0.3 | 0.1 | 0.1 |
| B-3 | | | | | |
| C [ppm] | 10 | 10 | 10 | 10 | 10 |
| D | 0.5 | 0.5 | 0.5 | 0.5 | 0.5 |
| SiH (b-1) | 0.75 | 0.12 | 0.34 | 0.15 | 0.11 |
| SiH (b-2) | 0 | 0.88 | 0.65 | 0.85 | 0.90 |
| SiH/Vi | 0.75 | 1.00 | 0.99 | 1.00 | 1.01 |
| 1/4 consistency | 25 | 21 | 15 | 58 | 31 |
| 1/4 consistency (after 225C/ 1000 hrs) | 22 | 20 | 13 | 37 | 19 |
| Crack resistance | 1000 hrs | 1000 hrs | 1000 hrs | 780 hrs | 1000 hrs |

TABLE 2

| | Comparative Example 1 | Comparative Example 2 | Comparative Example 3 | Comparative Example 4 | Comparative Example 5 |
|---|---|---|---|---|---|
| A-1 | 53.45 | 98.43 | 98.7 | 82.51 | 76.1 |
| A-2-1 | 40 | | | 6.5 | 9.75 |
| A-2-2 | | | | | |
| A-3 | | | | 3.5 | 5.25 |
| B-2 | 6.05 | | | 6.85 | 8.4 |
| B-1 | | 0.1 | 0.8 | | |
| B-3 | | 0.97 | | 0.14 | |
| C Pt metal content [ppm] | 10 | 10 | 10 | 10 | 10 |
| D | 0.5 | 0.5 | 0.5 | 0.5 | 0.5 |
| SIH (b-1) | 0 | 0.13 | 1.00 | 0 | 0 |
| SIH (b-2) | 1.00 | 0 | 0 | 0.90 | 1.00 |
| SIH/Vi | 1.00 | 1.01 | 1.00 | 1.01 | 1.00 |
| 1/4 consistency | 72 | 23 | 31 | 78 | 75 |
| 1/4 consistency (after 225° C./ 1000 hrs) | 51 | 18 | 19 | 58 | 55 |
| Crack resistance | 250 hrs | 170 hrs | 350 hrs | 350 hrs | 280 hrs |

SUMMARY

In the present Embodiments 1 to 11, the heat resistance of the resulting silicone gels and their resistance to cracking when heated at 225° C. from one direction for a long time were favorable, furthermore, the ¼ consistency of the silicone gels after 1000 hours at high temperature did not change significantly.

On the other hand, in the experimental examples of the compositions (Comparative Examples 1 to 5) with the amount and type of the organohydrogensiloxane used as the cross-linking agent outside the present invention, the heat resistance and crack resistance were confirmed to be insufficient. In particular, it was confirmed that cracks were generated within 400 hours when heated from one direction at 225° C. for a long time.

What is claimed is:

1. A silicone gel composition, comprising:

(A) 100 mass parts of an organopolysiloxane having a viscosity at 25° C. of 10 to 10,000 mPa·s, and having an alkenyl group bonded to at least two silicon atoms on average in a molecule;

(B-1) a branched organohydrogenpolysiloxane having a viscosity at 25° C. of 2 to 1,000 mPa·s, having three or more silicon atom-bonded hydrogen atoms in a molecule, and containing at least 20 mol % or more of siloxane units expressed by $SiO_{4/2}$, present in an amount at which hydrogen atoms bonded to a silicon atom is 0.1 to 0.8 per alkenyl group bonded to a silicon atom in the entire composition;

(B-2) a chain organohydrogenpolysiloxane having a viscosity at 25° C. of 2 to 1,000 mPa·s, and having two silicon-bonded hydrogen atoms in one molecule, present in an amount at which hydrogen atoms bonded to a silicon atom is 0 to 0.9 per alkenyl group bonded to a silicon atom in the entire composition;

(C) a platinum-based addition reaction catalyst, present in an amount at which the amount of platinum-based metal is 0.01 to 1,000 ppm with respect to the entire composition; and (D) 0.2 to 10.0 mass parts of a reaction product of (d1) alkali metal silanolate and (d2) one or more types of ceric salts selected from cerium chloride and carboxylates of cerium;

wherein the amount is such that the total number of hydrogen atoms bonded to a silicon atom of component (B-1) and component (B-2) is 0.7 to 1.2 per alkenyl group bonded to a silicon atom in the entire composition;

wherein component (A) is one or a mixture of the following:

(A-1) a branched organopolysiloxane having an alkenyl group bonded to at least two silicon atoms in a molecule; and (A-2) a linear organopolysiloxane having a viscosity at 25° C. of 1.0 to 10,000 mPa·s, and having an alkenyl group bonded to at least two silicon atoms in a molecule; and wherein component (B-2) is a linear organohydrogenpolysiloxane having silicon-bonded hydrogen atoms only at both molecular chain terminals, and having a viscosity at 25° C. within a range of 2 to 200 mPa·s; and wherein component (A) comprises component (A-1), and of all siloxane units configuring the branched organopolysiloxane molecule of component (A-1), 80.0 to 99.8 mol % are $R_2SiO_{2/2}$ units, 0.1 to 10.0 mol % are $RSiO_{3/2}$ units, and 0.1 to 10.0 mol % are $R_3SiO_{1/2}$ units, where all cases of R represent a monovalent hydrocarbon group bonded to a silicon atom; and wherein the (B-1) branched organohydrogenpolysiloxane is an $M^HQ$ resin.

2. The silicone gel composition according to claim 1, wherein of the monovalent hydrocarbon groups bonded to the silicon atoms of component (A-1), 0.25 to 4.00 mol % are alkenyl groups bonded to a silicon atom.

3. The silicone gel composition according to claim 1, wherein component (D) contains 0.5 to 5.0 mass % of metal cerium.

4. The silicone gel composition according to claim 1, wherein component (d1) is an alkali metal silanolate compound obtained by further reacting a reaction product obtained by ring-opening reacting (d1-1) one or more cyclic organopolysiloxane with (d1-3) an organopolysiloxane having a viscosity at 25° C. of 10 to 10,000 mPa·s using (d1-2) an alkali metal hydroxide.

5. The silicone gel composition according to claim 1, wherein component (D) is present in an amount at which the cerium metal content in component (D) is 0.005 to 0.15 mass %, with respect to the entire composition.

6. A silicone gel cured product obtained by curing the silicone gel composition according to claim 1.

7. The silicone gel cured product according to claim 6, which is substantially transparent and has a direct reading value at ¼ consistency as stipulated in JIS K2220 within a range of 10 to 150.

8. An electronic component encapsulant, comprising the silicone gel composition according to claim 1.

9. The electronic component encapsulant according to claim 8, which is a substantially transparent power device encapsulant.

10. An electronic component, comprising the silicone gel cured product according to claim 8.

11. The electronic component according to claim 10, which is a power device.

12. An optical semiconductor device, comprising a structure in which an optical semiconductor element is encapsulated by the silicone gel cured product according to claim 8.

13. A general lighting equipment, optical member, or optoelectronic member, comprising the silicone gel cured product according to claim 8.

14. The silicone gel composition according to claim 1, wherein the branched organopolysiloxane (A-1) conforms to the formula $(R_3SiO_{1/2})$ $l(R_2SiO_{2/2})$ m $(RSiO_{3/2})$ n where l, m, and n each represent one or more numbers, and l+m+n is 200 or less.

15. The silicone gel composition according to claim 1, wherein the (B-1) branched organohydrogenpolysiloxane conforms to the following formula:

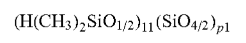

where 11+p1=1.

16. The silicone gel composition according to claim 15, wherein 0.1≤11≤0.80 and 0.20≤p1≤0.90.

* * * * *